United States Patent [19]

Asahina

[11] Patent Number: 5,406,215
[45] Date of Patent: Apr. 11, 1995

[54] OPEN DRAIN DRIVER CIRCUIT WHICH ELIMINATES OVERSHOOT CAUSED BY PARASITIC CAPACITANCES

[75] Inventor: Katsushi Asahina, Itami, Japan

[73] Assignee: Mitsubishi Denki Kabushiki Kaisha, Tokyo, Japan

[21] Appl. No.: 45,937

[22] Filed: Apr. 12, 1993

[30] Foreign Application Priority Data

Apr. 14, 1992 [JP] Japan .................. 4-094158

[51] Int. Cl.$^6$ .......................................... H03K 17/16
[52] U.S. Cl. ........................................ 326/27; 326/83; 327/380
[58] Field of Search .............. 307/443, 451, 475, 579, 307/246, 263

[56] References Cited

U.S. PATENT DOCUMENTS

| | | | |
|---|---|---|---|
| 4,103,188 | 7/1978 | Morton | 307/451 |
| 4,797,579 | 1/1989 | Lewis | 307/443 |
| 5,023,472 | 6/1991 | Hashimoto et al. | 307/443 |
| 5,023,488 | 6/1991 | Gunning | 307/475 |
| 5,028,819 | 7/1991 | Wei et al. | 307/451 |
| 5,034,629 | 7/1991 | Kinugasa et al. | 307/443 |
| 5,151,615 | 9/1992 | Egawa | 307/443 |

FOREIGN PATENT DOCUMENTS 0332301  2/1989  European Pat. Off.

OTHER PUBLICATIONS

Gunning et al., "GTL: A Low Voltage Swing Transmission Line Transceiver"; published in JEDEC, Solid State Products Engineering Council; JC-35-31, Survey Ballot; Aug. 2, 1991.

*Primary Examiner*—Edward P. Westin
*Assistant Examiner*—Benjamin D. Driscoll
*Attorney, Agent, or Firm*—Christopher R. Pastel; Thomas R. Morrison

[57] ABSTRACT

An open drain output circuit includes a package having a reference potential section on at least a portion thereof. An output terminal of the circuit disposed on the package is connected through a load resistor to an external power supply. A common terminal also disposed on the package is connected to an external point of reference potential. A parasitic load capacitance is formed between the common terminal and the load resistor. A field effect transistor having drain, source and gate regions is disposed within the package. The drain and source regions are connected to the output and common terminals, respectively. The conductivity of the drain-source conduction path is variable in accordance with the value of a control voltage applied between the gate and source regions. Connections of the drain and source regions to the output and common terminals, respectively, provide parasitic inductances. Parasitic capacitance is formed between the drain region and the reference potential section and between the source region and the reference potential section. Control voltage generating means generates the control voltage in such a manner that the rate of change of the control voltage decreases as it changes from a high level to a low level and overshoot in the output signal is thereby reduced.

14 Claims, 5 Drawing Sheets

OPEN DRAIN DRIVER CIRCUIT WHICH ELIMINATES OVERSHOOT CAUSED BY PARASITIC CAPACITANCES

This invention relates to an open drain circuit which may be disposed in, for example, a semiconductor integrated circuit.

BACKGROUND OF THE INVENTION

An example of conventional open drain circuit is shown in FIG. 1. The open drain circuit of a FIG. 1 comprises a package 10 having an output terminal 12 and a common (ground) terminal 14. The output terminal 12 is coupled through a load resistor 16 to an external voltage supply 18 providing a power of $+V_{TT}$, and the common terminal 14 is grounded. The load resistor 16 forms a load capacitance 20 between the output terminal 12 and the common terminal 14.

The drain region of an output transistor 22, an N-channel MOSFET in this case, is connected through a transmission line to the output terminal 12, and the source region of the output transistor 22 is connected through a transmission line to the common terminal 14. The connection of the output transistor 22 by the transmission lines produces parasitic inductances 24 and 26 between the drain region and the output terminal and between the source region and the common terminal 14, respectively. Although not shown, at least a portion of the package 10 is a metallic portion which provides a reference potential point, and parasitic capacitances 28 and 30 are exhibited between the metallic portion and the drain region and between the metallic portion and the source region, respectively.

A control voltage is applied between the gate and source regions of the output transistor 22 through two stages of inverters 32 and 34. The inverter 32 comprises a P-channel MOSFET 32P and an N-channel MOSFET 32N. The drain of the MOSFET 32P is connected to the drain of the MOSFET 32N, the source of the MOSFET 32P is connected to a voltage supply 36 of $+V_{DD}$ within the package 10, and the source of the MOSFET 32N is connected to the source region of the output transistor 22.

Similarly, the inverter 34 comprises a P-channel MOSFET 34P and an N-channel MOSFET 34N, with the drains of the MOSFET's 34P and 34N connected together, with the source of the MOSFET 34P connected to the $V_{DD}$ voltage supply 36, and with the source of the MOSFET 34N connected to the source region of the output transistor 22.

The output node of the inverter 34, i.e. the junction of the drains of the P-channel and N-channel MOSFET's 34P and 34N is coupled to the gate region of the output transistor 22. The output node of the inverter 32, i.e. the junction of the drains of the MOSFET's 32P and 32N, is coupled to the gate regions of the MOSFET's 34P and 34N. An input voltage is applied to the gate regions of the MOSFET's 32P and 32N via an input terminal 38. The input voltage assumes two values, H and L, which correspond respectively to $+V_{DD}$ and ground potential.

In the above-stated arrangement, with the parasitic inductances 24 and 26 and the parasitic capacitances 28 and 30 not being not taken into consideration, when an H-level input signal is applied, the P-channel MOSFET 32P is non-conductive, and the N-channel MOSFET 32N is conductive so that an L-level signal is applied as an output of the inverter 32 to the gate regions of the P-channel MOSFET 34P and N-channel MOSFET 34N. As a result, the MOSFET 34P becomes conductive, while the MOSFET 34N is non-conductive. This causes the output transistor 22 to become conductive so that current $I_D$ will flow from the external power supply 18 into the output transistor 22. When the resistance value of the load resistor 16 is $R_L$, the voltage at the output terminal 12 is $+V_{TT}-I_D \cdot R_L$, i.e. the L-level.

Conversely, when the input voltage at the input terminal 38 is at the L-level, the output signal of the inverter 32 is at the H-level, and the output signal of the inverter 34 is at the L-level, which results in the non-conduction of the output transistor 22 so that the voltage at the output terminal 12 is at $+V_{TT}$ or H-level.

In the above discussion, the parasitic inductances 24 and 26 and the parasitic capacitances 28 and 30 have not been taken into account. Actually, however, these factors influence the operation of the circuit so that when the input voltage at the input terminal 38 changes from the H-level to the L-level, overshoot, undershoot and ringings may disadvantageously be produced in the output signal at the output terminal 12 and in the signal at the source region of the output transistor 22.

Specifically, when the input voltage at the terminal 38 is at the H-level, the output transistor 22 is conductive so that current flows from the power supply 18 to the load resistor 16, which current is divided into portions flowing into the load capacitance 20 and the parasitic inductance 24. The current flowing through the parasitic inductance 24 is further divided into portions flowing into the parasitic capacitance 28 and the output transistor 22. The current flowing into the output transistor 22 is further divided into portions flowing into the parasitic capacitance 30 and the parasitic inductance 26. Thus, while these currents are flowing, energy is stored in the parasitic inductance 24 and 26 and in the load capacitance 20, and parasitic capacitance 28 and 30.

When the input voltage at the input terminal 38 begins to change from the H-level to the L-level at a time $t_6$, as shown in FIG. 2(a), the gate voltage of the output transistor 22 will change from the H-level to the L-level at a time delayed from the time $t_6$ by a time period required for the input voltage to pass through the inverters 32 and 34, as shown in FIG. 2(b). This change in the gate voltage of the output transistor 22 causes current flowing between the drain and the source of the output transistor 22 to change, which results in the discharge of energy stored in the parasitic inductances 24 and 26 and the load capacitances 20, and parasitic capacitances 28 and 30. During a time when the gate voltage of the output transistor 22 is changing from the H-level to the L-level, a relatively long time is required for the energy to decrease since the resistance value exhibited between the source and drain of the output transistor 22 is relatively small. As a result, an overshoot and an undershoot are generated in the voltage at the output terminal 12 as shown in FIG. 2(c), and ringings are generated in the voltage at the source region of the output transistor 22 as shown in FIG. 2(d).

During a period when the input voltage at the input terminal 38 is at the L-level, current flowing from the power supply 18 into the load resistor 16 is divided into two portions, one flowing into a circuit branch including the parasitic inductances 24 and 26 and the parasitic capacitances 28 and 30 and the other flowing into a branch including the load capacitance 20. Energy has been stored in the parasitic inductances 24 and 26 and in the parasitic capacitances 28 and 30 and load capacitance 20. When the input voltage at the input terminal 38 changes from the L-level to the H-level at a time $t_7$ as shown in FIG. 2(a), the output output transistor 22 is rendered conductive and current begins to flow between the drain and source of the transistor 22. At the beginning of this transition of the input voltage from the L-level to the H-level, the drain-source resistance of the output transistor 22 is large, and, therefore, the energy stored in the parasitic inductances 24 and 26 and the load capacitance 20, and parasitic capacitances 28 and 30 is released through this large drain-source resistance. Thus, the energy is attenuated in a relatively short time period. Accordingly, as shown in FIGS. 2(c) and 2(d), after the time $t_7$, no significant overshoot, undershoot or ringings occur in the voltage at the output terminal 12 and in the voltage at the source region of the output transistor 22.

As described above, conventional open drain output circuit have a problem that large overshoot, undershoot and ringings occur when the input voltage and, hence, the control voltage change from the H-level to the L-level.

SUMMARY OF THE INVENTION

According to one aspect of the present invention, an open drain circuit includes a package having a reference potential section on at least a portion thereof, an output terminal provided on the package and electrically connected to an external power supply through a load resistor, and a common terminal provided on the package and connected to an external point of reference potential, with a load capacitance exhibited between the common terminal and the load resistor. A field effect transistor having a drain region, a source region and a gate region is disposed in the package with the drain region connected to the output terminal and with the source region connected to the common terminal. The electrical conductivity exhibited between the drain and source regions of the field effect transistor changes in accordance with the magnitude of a control voltage applied between the gate and source regions of the transistor. The connection of the drain region to the output terminal and the connection of the source region to the common terminal cause parasitic inductances to be produced. Further, parasitic capacitances are exhibited between the drain region and the reference potential section of the package and between the source and the reference potential section, respectively. Control voltage generating means generates the control voltage in accordance with an input voltage applied to the circuit in such a manner that the rate of change of the control voltage decreases, when control voltage changes from the high level (It-level) to the low level (L-level).

According to a second aspect of the invention, an open drain output circuit includes, in addition to a circuit arrangement similar to that of the first invention, a charged capacitor the and discharge means for causing the charge on the said charged capacitor to flow into the drain and source regions of the field effect transistor when the control voltage changes from the high level to the low level.

PREFERRED EMBODIMENTS

Figure 1:
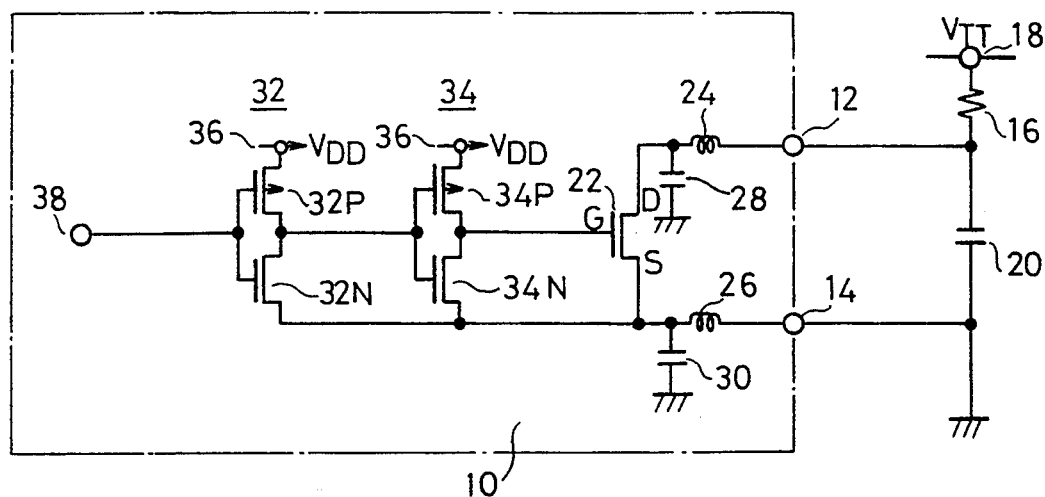
FIG. 1 is a circuit diagram of a conventional open drain output circuit.
Figure 2A:
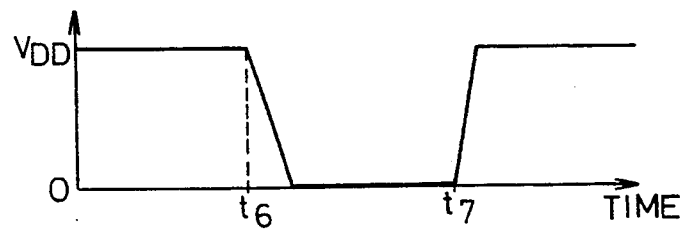
FIG. 2(a) shows the input voltage at the input terminal of the circuit depicted in FIG. 1.
Figure 2B:
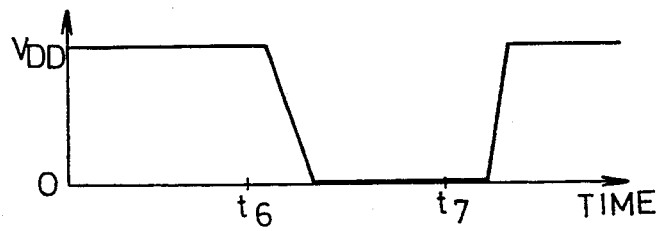
FIG. 2(b) shows the gate voltage of the output transistor of the circuit depicted in FIG. 1.
Figure 2C:
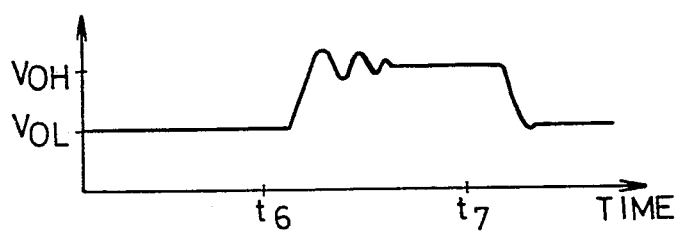
FIG. 2(c) shows the output voltage of the output transistor of the circuit depicted in FIG. 1.
Figure 2D:
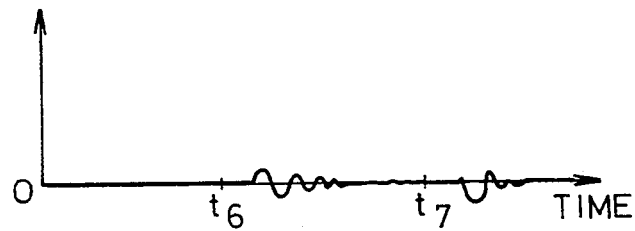
FIG. 2(d) shows the source voltage of the output transistor of the circuit depicted in FIG. 1.
Figure 3:
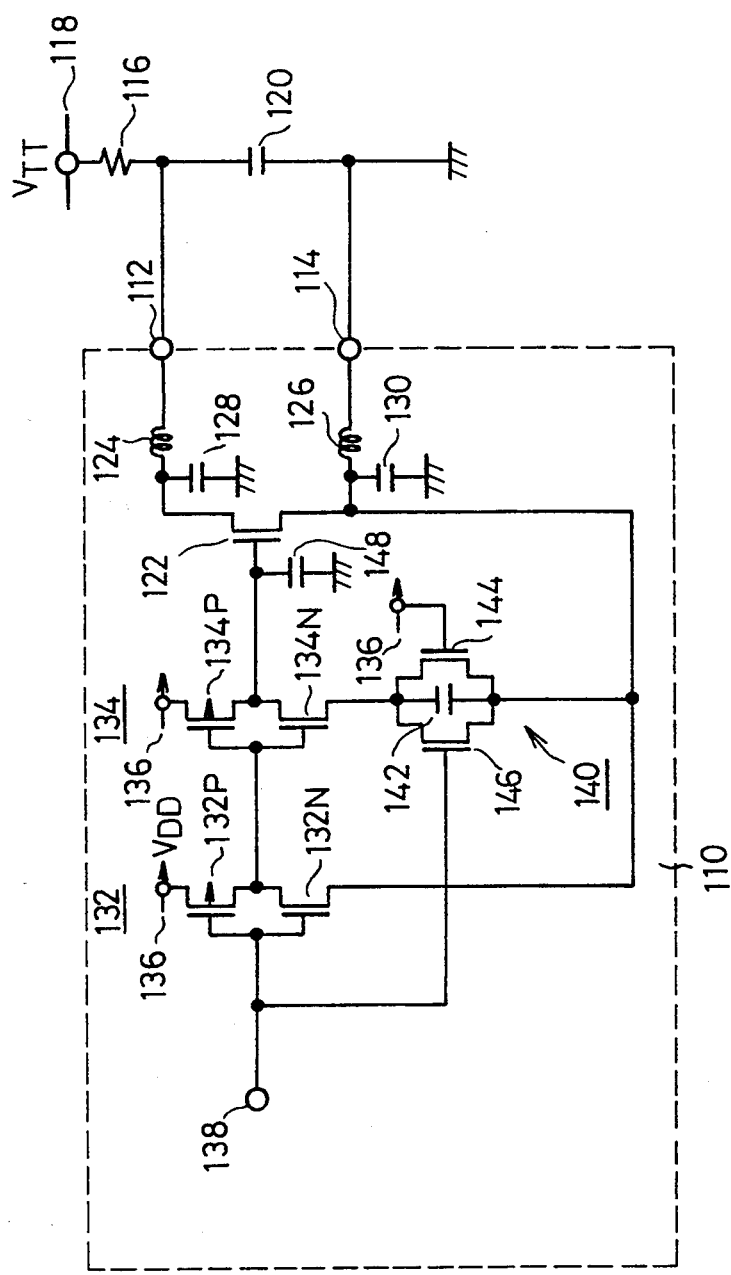
FIG. 3 is a circuit diagram of an open drain output circuit according to one embodiment of the present invention.
Figure 4:
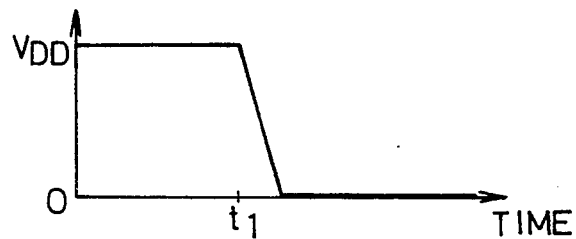
FIG. 4(a) shows the input voltage at the input terminal of the circuit depicted in FIG. 3.
FIG. 4(b) shows the output voltage of the first inverter and the gate voltage of the second inverter of the circuit depicted in FIG. 3.
FIG. 4(c) shows the output voltage of the second inverter and the gate voltage of the output transistor of the circuit depicted in FIG. 3.
FIG. 4(d) shows the output voltage of the output transistor of the circuit depicted in FIG. 3.
FIG. 4(e) shows the voltage across the parallel circuit capacitor of the circuit depicted in FIG. 3.
Figure 4:
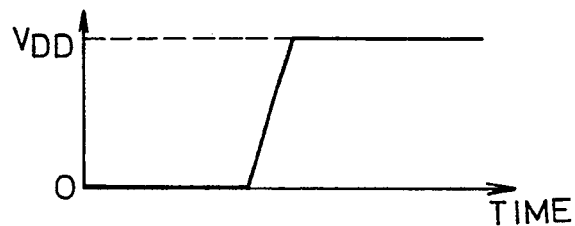
Figure 4:
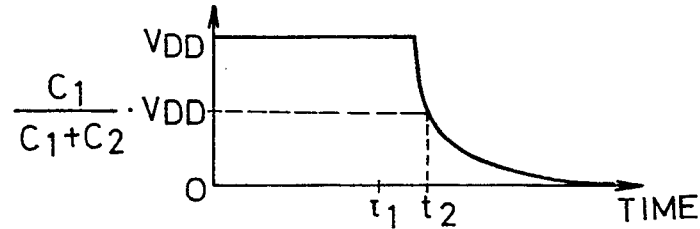
Figure 4:
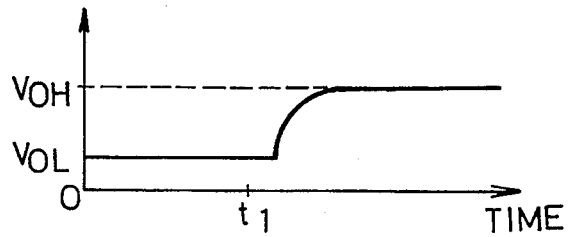
Figure 4:
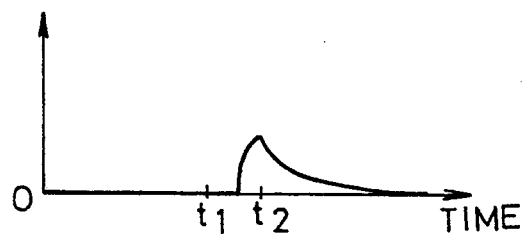

One embodiment of the present invention is shown in FIG. 3, and signal waveforms appearing at various portions of the circuit are shown in FIG. 4. The open drain circuit shown in FIG. 3 includes a package 110 in which a circuit is enclosed. An output terminal 112 and a common terminal 114 are disposed on the package 110. The package 110 includes on at least a portion thereof a metallic portion which provides a reference potential point. An output transistor 122, which is an N-channel MOSFET in this example, is disposed within the package 110, and has its drain region connected to the output terminal 112 and has its source region connected to the common terminal 114. As in the case of the conventional circuit shown in FIG. 1, parasitic inductors 124 and 126 are produced due to the respective connections of the drain and source regions of the output transistor 122 to the output and common terminals, respectively. In addition, a parasitic capacitance 128 is present between the drain region and the reference potential surface of the package 110, and a parasitic capacitance 130 is present between the source region and the reference potential surface of the package 110.

The output terminal 112 is connected through a load resistor 116 to a power supply 118 external to the package 110. The power supply 118 provides a voltage of $+V_{TT}$. The connection of the load resistor 116 to the output terminal causes a load capacitance 120 to be formed between the output terminal 112 and the common terminal 114.

An input voltage applied at an input terminal 138 is coupled to the gate region of the output transistor 122 through inverters 132 and 134. The input voltage changes between $+V_{DD}$ (i.e. H-level) and ground potential (i.e. L-level). The inverter 132 like the inverter 32 of Figure 1 includes a P-channel MOSFET 132P and an N-channel MOSFET 132N, with the gates of both MOSFET's connected together to the input terminal 138, with the source of the MOSFET 132P being connected to a $+V_{DD}$ voltage supply 136 within the package 110, and with the source of the MOSFET 132N connected to the source region of the output transistor 122. Similarly, the inverter 134 includes a P-channel MOSFET 134P and an N-channel MOSFET 134N. The gates of the MOSFET's 134P and 134N are connected to the interconnected drains of the MOSFET's 132P and 132N. The drains of the MOSFET's 134P and 134N are connected together to the gate of the output transistor 122. While the source of the MOSFET 134P is connected directly to the $+V_{DD}$ voltage supply 136, the source of the MOSFET 134N is connected to the source region of the output transistor 122 not directly but through a parallel circuit 140.

The parallel circuit 140 includes a capacitor 142 having a capacitance value of C2, and two N-channel MOSFET's 144 and 146 having their drain and source regions connected to one and the other ends of the capacitor 142, respectively. The gate of the MOSFET 144 receives a voltage of $+V_{DD}$ from the voltage supply 136 so that the MOSFET 144 is always conductive. The resistance value exhibited between the drain and source regions of the MOSFET 144 in its ON (conductive) state is larger than that of the MOSFET 134N in its ON state. The gate of the MOSFET 146 is connected to the input terminal 138. Accordingly, when the input voltage at the input terminal 138 is at the H-level, the MOSFET 146 is turned ON.

The outputs transistor MORFET's 122, 132P, 132N, 134P, 134N, 144 and 146, and the capacitor 142 are disposed on the same semiconductor chip (not shown) by the same manufacturing process, and packaged in the package 110. The manufacturing process produces a parasite gate capacitance 148 having a value of C1 between the gate region of the output transistor 122 and a point of ground potential.

In operation, when the voltage at the input terminal 138 is at the H-level, the output of the inverter 132 is at the L-level so that the P-channel MOSFET 134P of the inverter 134 is turned on, while the N-channel MOSFET 134N is turned off. At this instant, since $+V_{DD}$ is applied from the voltage supply 136 to the gate region of the output transistor 122 through the MOSFET 134P, the gate capacitance 148 is charged, and a drain current $I_D$ flows in the output transistor 122. Then, energy is stored in the parasitic inductances 124 and 126, in the parasitic capacitances 128 and 130, and in the load capacitance 120. Since the input terminal 138 is at the H-level, the MOSFET 146 is conductive so as to short circuit the end terminals of the capacitor 142 to thereby discharge the capacitor 142. The voltage $V_{OL}$ at the output terminal 112 under this condition is $V_{OL}=V_{TT}-I_D \cdot R_L$, where $R_L$ is the resistance value of the load resistor 116.

Under this condition, when the change of the input voltage at the input terminal 138 from the H-level to the L-level is initiated at a time $t_1$ as shown in FIG. 4(a), the output of the inverter 132 changes toward the H-level as shown in FIG. 4(b) so that the P-channel MOSFET 134P of the inverter 134 is rendered non-conductive. At this instant, the N-channel MOSFET 144 is conductive, and, accordingly, the N-channel MOSFET 134N is also becomes conductive. The MOSFET 146 now becomes non-conductive so that the capacitor 142 is released from the short-circuit state.

This causes the charge ($V_{DD} \times C1$) on the parasitic gate capacitance 148 move through the N-channel MOSFET 134N to the capacitor 142. However, at this instant, the resistance of the N-channel MOSFET 134N when it is conductive (hereinafter such resistance being referred to as ON-resistance) is smaller than the ON-resistance of the N-channel MOSFET 144, and, therefore, the charge moves rapidly and the voltage across the parasitic gate capacitance 148 decreases rapidly. When the voltage across the parasitic gate capacitance 148 becomes equal to the voltage across the capacitor 142, the movement of charge ceases. Assuming that the ON-resistance of the MOSFET 134N is negligible, the voltages across the parasitic gate capacitance 148 and the capacitor 142 are equal to $V_{DD} \cdot C1/(C1+C2)$, as indicated in FIG. 4(c) at a time $t_2$.

After this time $t_2$, charge on the capacitor 142 is discharged through the MOSFET 144 connected across the capacitor 142, but, since the ON-resistance of the MOSFET 144 is relatively larger than that of MOSFET 134N, the discharge of the capacitor 142 takes place gradually. As the capacitor 142 discharges, the parasitic gate capacitance 148 discharges into the capacitor 142. Since the discharge of the capacitor 142 is gradual, the discharge of the parasitic gate capacitance 148 is also gradual. That is, as shown in FIG. 4(c), after the time $t_2$, the decrease of the voltage across the capacitance 148 is gradual.

Thus, the voltage at the gate region of the output transistor 122 decreases rapidly during a time period from $t_1$ to $t_2$. That is, the rate of change of the gate voltage is large. After the time $t_2$, the gate voltage decreases slowly. That is, the rate of change of the gate voltage after the time $t_2$ is smaller. Accordingly, the resistance between the drain and source regions of the output transistor 122 increases rapidly toward the value corresponding to the gate voltage $V_{DD} \cdot C1/(C1+C2)$, but, thereafter, it decreases slowly. Thus, the resistance between the drain and source regions of the output transistor 122 is at a value intermediate between the value in the fully conductive state and the value in the fully non-conductive state for a relatively long time period after the time $t_2$. Because the energy stored in the parasitic capacitances 128, 130, the parasitic inductances 124, 126, and the load capacitance 120 is dissipated in the output transistor 122 of this intermediate resistance value, the output voltage appearing at the output terminal 112 increases to $V_{OH}(=V_{TT})$ with no overshoot, undershoot or ringing accompanying, as shown in FIG. 4(d). Similarly, the voltage at the junction of the MOSFET 134N and the capacitor 142 has no overshoot, undershoot or ringing, as shown in FIG. 4(e).

As stated previously, the output transistor 122 and the capacitor 142 are fabricated by the same process. The parasitic gate capacitance 148 of the output transistor 122 is $W1 \cdot L1 \cdot \alpha$, where W1 is the gate width, L1 is the gate length, and a is a factor determined dependent on the fabrication process. Also, the capacitance of the capacitor 142 is $W2 \cdot L2 \cdot \alpha$, where W2 is the width of the electrode plates, and L2 is the electrode plate length. Accordingly, as long as the same manufacturing process is employed for fabricating open drain output circuits, the value of C1/(C1+C2) is always the same from circuit to circuit, and, accordingly, the value of the voltage $V_{DD} \cdot C1/(C1+C2)$ applied to the gate of the output transistor 122 is always the same in all of the open drain output circuits manufactured by the same process.

Figure 5:
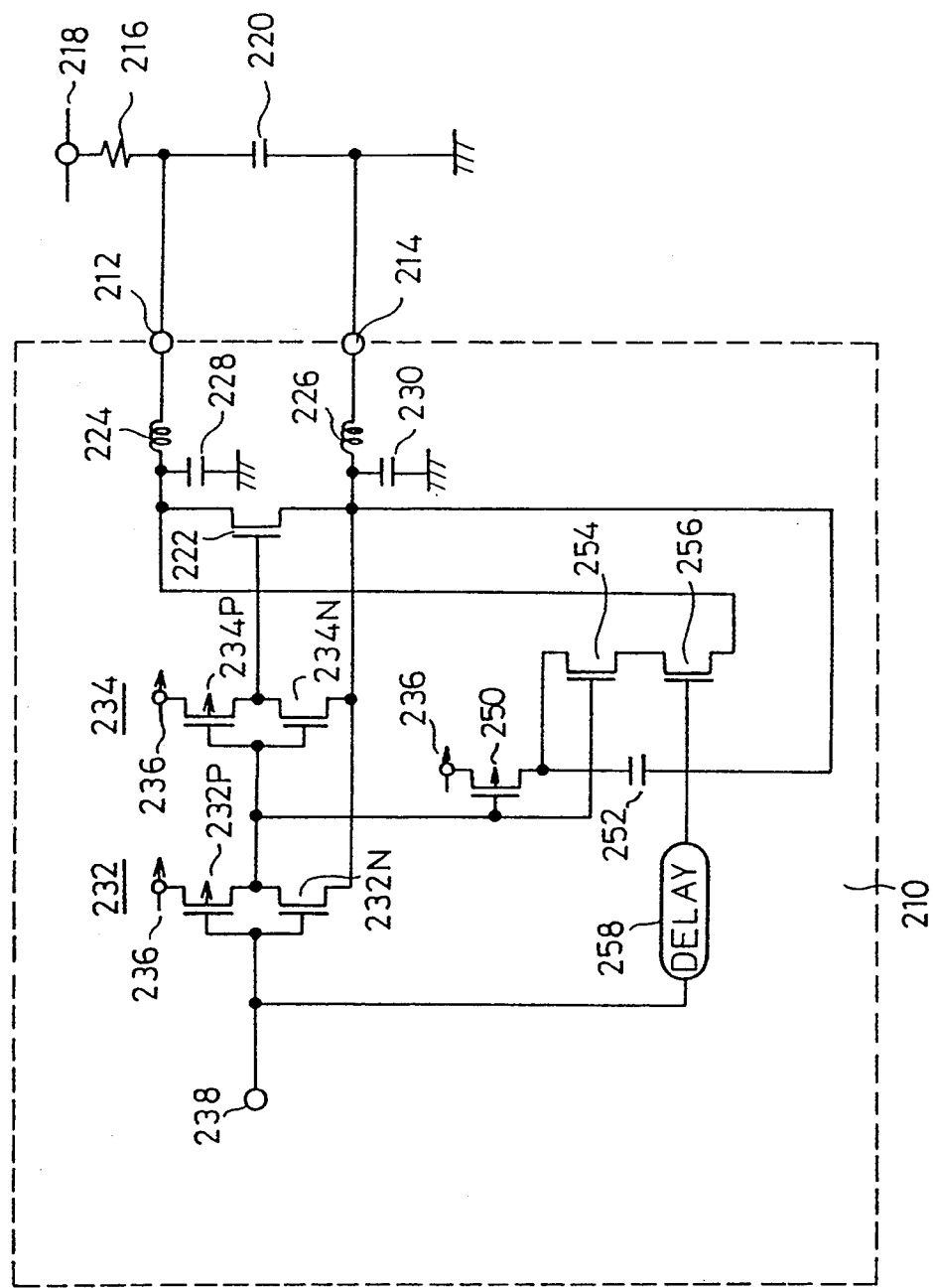
FIG. 5 is a circuit diagram of an open drain output circuit according to another embodiment of the present invention.
Figure 6:
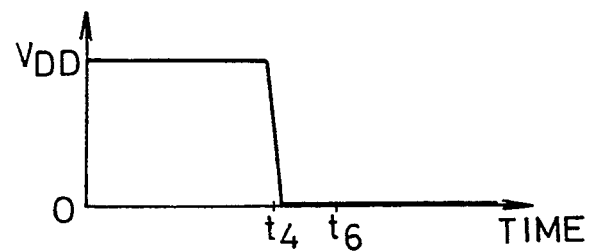
FIG. 6(a) shows the input voltage at the input terminal of the circuit depicted in FIG. 5.
FIG. 6(b) shows the output voltage of the first inverter and the gate voltage of the second inverter of the circuit depicted in FIG. 5
FIG. 6(c) shows the output voltage of the second inverter and the gate voltage of the output transistor of the circuit depicted in FIG. 5.
FIG. 6(d) shows the output voltage of the output transistor of the circuit depicted in FIG. 5.
FIG. 6(e) shows the output voltage of the delay means of the circuit depicted in FIG. 5.
Figure 6:
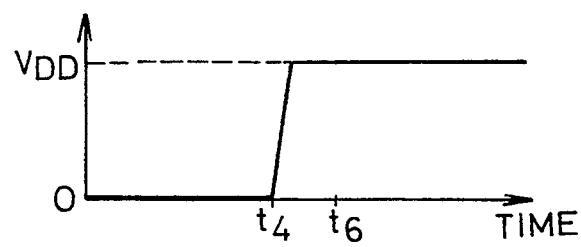
Figure 6:
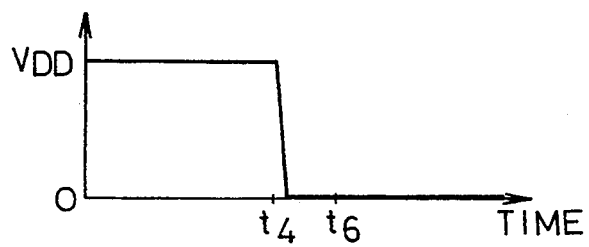
Figure 6:
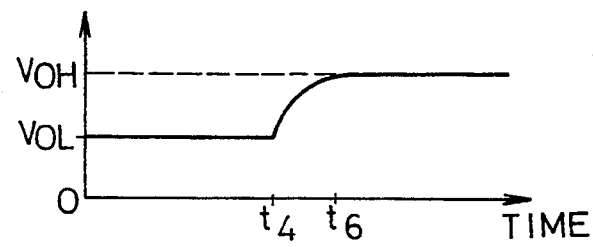
Figure 6:
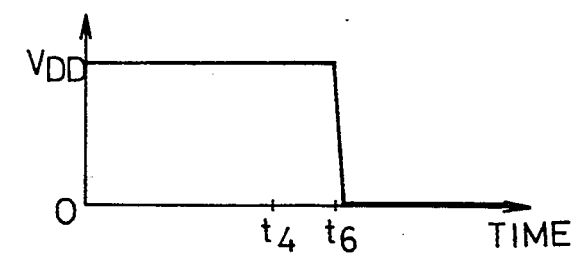

An open drain output circuit according to another embodiment of the present invention is shown in FIG. 5, and signal waveforms at various portions of the circuit of FIG. 5 are shown in FIG. 6. The circuit of FIG. 5 also comprises a package 210, with an output terminal 212 and a common terminal 214 being disposed on it. An output transistor 222, which, in this case, is an N-channel MOS transistor, is enclosed in this package 210. The output transistor 222 has its drain region connected to the output terminal 212 and has its source region connected to the common terminal 214. Due to these connections, parasitic inductances 224 and 226 are formed. The package 210 has a reference potential section, and parasitic capacitances 228 and 230 are formed between the reference potential section of the package 210 and the source region of the output transistor 222 and between the reference potential section and the drain region of the output transistor 222, respectively.

An input voltage at a H-level ($+V_{DD}$) or at a L-level (ground) coupled to an input terminal 238 is applied between the gate and source regions of the output transistor 222 through inverters 232 and 234. Similar to the inverters 32 and 34 shown in FIG. 1, the inverter 232 comprises a P-channel MOSFET 232P and an N-channel MOSFET 232N, and the inverter 234 comprises a P-channel MOSFET 234P and an N-channel MOSFET 234N.

Between a $+V_{DD}$ voltage supply 236 and the source region of the output transistor 222, a series circuit of the drain-source conduction path of a P-channel MOSFET 250 and a capacitor 252 is connected. The gate region of the MOSFET 250 receives an output signal from the inverter 232.

The junction of the source region of the MOSFET 250 and the capacitor 252 is connected to the drain region of the output transistor 222 through two N-channel MOSFET's 254 and 256 having their drain-source conduction paths connected in series. In other words, a series combination of the MOSFET's 254 and 256 and the capacitor 252 is connected in parallel with the drain-source conduction path of the output transistor 222. The gate region of the MOSFET 254 receives an output signal of the inverter 232, and an input voltage at the input terminal 238 is applied through delay means 258 to the gate of the MOSFET 256. For example, a plurality of transfer gates connected in series may be used as the delay means 258.

When the input voltage at the input terminal 238 is at the H-level, the output signal of the inverter 232 is at the L-level, which causes the P-channel MOSFET 250 to be conductive and causes the capacitor 252 to be charged. At this instant, the output of the inverter 234 is at the H-level, which renders the output transistor 222 conductive, and energy is stored in the parasitic inductances 224 and 226, the parasitic capacitances 228 and 230, and a load capacitance 220 connected as shown.

Under this condition, when the input voltage at the input terminal 238 changes from the H-level to the L-level at a time $t_4$ as shown in FIG. 6(a), the output of the inverter 232 changes from the L-level to the H-level as shown in FIG. 6(b) and the output signal of the inverter 234 changes from the H-level to the L-level as shown in FIG. 6(c). This causes the output transistor 222 to be non-conductive so that its drain current is cut off. Then the energy which has been stored in the parasitic inductances 224 and 226, the parasitic capacitances 228 and 230 and the load capacitance 220 tends to be discharged as current. Also, as a signal at the H-level is applied from the inverter 232 to the gate of the MOSFET 250, the FET 250 becomes non-conductive, and charging of the capacitor 252 is ceases.

At this instant, a signal at the H-level is also applied from the inverter 232 to the gate of the MOSFET 254. While the input voltage at the input terminal 238 begins to change from the H-level to the L-level, the gate of the FET 256 receives a signal at the H-level because of the delay means 258, as shown in FIG. 6(e). Thus, both MOSFET's 254 and 256 become conductive to let charge on the capacitor 252 flow into the drain region of the output transistor 222 through MOSFET's 254 and 256. This functions to suppress energy stored in the parasitic inductances 224, 226, the parasitic capacitances 228, 230 and the load capacitance 220 from being released. Accordingly, as shown in FIG. 6(d), no overshoot, undershoot or ringing is generated in the output voltage at the output terminal 212. The stored energy is dissipated by the MOSFET's 254 and 256 when it is released through these MOSFET's. This also functions to suppress occurrence of overshoot, undershoot and ringing.

One might contemplate supplying current from the voltage supply 236, instead of charge on the capacitor 252, to the drain region of the output transistor 222 through the MOSFET's 254 and 256 when they are conductive, to prevent occurrence of overshoot, undershoot and ringing. However, in such a case, current should be drawn rapidly from the voltage supply 236, which causes large changes in the voltage of the voltage supply 236 and, hence, noise. In contrast, in the open drain circuit of FIG. 5, because the voltage supply 236 charges only the capacitor 252, no significant voltage change and, hence, no noise is produced.

In the embodiments described above, the voltage at the output terminals 112, 212 is at a level opposite to that of the input signal applied to the input terminal 138, 238, but the circuits may be modified to develop an output voltage at the output terminals 112, 212 which is at the same level as the input voltage at the input terminals 138, 238, by, for example, using one additional inverter stage.

What is claimed is:

1. An open drain output circuit comprising:
 a package having a reference potential section on at least a portion thereof;
 an output terminal disposed on said package and connected through a load resistor to an external power supply;
 a common terminal disposed on said package and coupled to an external reference potential point, a parasitic load capacitance being formed between said common terminal and said load resistor;
 a field effect transistor disposed within said package and having a drain region, a source region and a gate region, said drain region being connected to said output terminal, said source region being connected to said common terminal, the conductivity of the drain-source conduction path of said field effect transistor changing in accordance with a control voltage applied between said gate region and said source region;

parasitic inductances being formed due to the connection of said drain region to said output terminal and the connection of said source region to said common terminal;

parasitic capacitances being formed between said drain region and said reference potential section and between said source region and said reference potential section, respectively; and means for generating said control voltage in accordance with an input voltage to said open drain circuit so that the rate of change of said control voltage decreases while said control voltage is changing from a high level to a low level.

2. An open drain output circuit according to claim 1 wherein said control voltage generating means includes a capacitance of said gate region of said field effect transistor, charging means for charging said capacitance of said gate region of said field effect transistor when said control voltage is at the high level, and discharging means connected between said gate region and source region of said field effect transistor, said discharging means comprising a series combination of conduction means and a parallel combination of a resistor and a capacitor, said conduction means conducting with a predetermined ON-resistance when said control voltage changes from the high level to the low level, said resistor in said parallel combination having a resistance value larger than said ON-resistance of said conduction means.

3. An open drain output circuit according to claim 2 wherein said charging means and said conduction means form an inverter.

4. An open drain output circuit according to claim 2 wherein said parallel combination includes short-circuiting means for short-circuiting said capacitor when said control voltage is at the high level.

5. An open drain output circuit according to claim 2 wherein said field effect transistor and said capacitor are fabricated by the same manufacturing process.

6. An open drain output circuit comprising:
a package having a reference potential section on at least a portion thereof;
an output terminal disposed on said package and connected through a load resistor to an external power supply;
a common terminal disposed on said package and coupled to an external reference potential point, a parasitic load capacitance being formed between said common terminal and said load resistor;
a field effect transistor disposed within said package and having a drain region, a source region and a gate region, said drain region being connected to said output terminal, said source region being connected to said common terminal, the conductivity of the drain-source conduction path of said field effect transistor changing in accordance with a control voltage applied between said gate region and said source region;
parasitic inductances being formed due to the connection of said drain region to said output terminal and the connection of said source region to said common terminal;
parasitic capacitances being formed between said drain region and said reference potential section and between said source region and said reference potential section, respectively;
means for generating said control voltage in accordance with an input voltage to said open drain circuit;
a charged capacitor; and
discharging means for causing charge on said capacitor to flow into said drain region of said field effect transistor when said control voltage changes from a high level to a low level.

7. An open drain output circuit according to claim 6 wherein said discharging means comprises resistor means connected in series with said capacitor, the series combination of said resistor means and said capacitor being connected between said drain region and source region of said field effect transistor.

8. An open drain output circuit according to claim 6 wherein said capacitor is charged from a voltage supply with said package while said control voltage is at the high level.

9. A driver circuit having an output functioning in conjunction with a pull-up resistor comprising:
a field effect transistor having a drain region, a source region, a gate region, and a drain-source conduction path having a conductivity and having a resistance;
said drain region being connected to an output terminal;
said source region being connected to a reference potential;
an input terminal;
means for driving said gate of said field effect transistor coupled to said input terminal and applying a control voltage to said gate of said field effect transistor;
said means for driving including means for generating a control voltage waveform for maintaining said field effect transistor in an intermediate resistance value between a fully conductive state and a fully non-conductive state for a predetermined time period during a transition of said field effect transistor from a high conductivity state to a low conductivity state.

10. A driver circuit according to claim 9 wherein:
said field effect transistor has a first parasitic capacitance between said drain region and said reference potential, a second parasitic capacitance between said source region and said reference potential, and a third parasitic capacitance between said gate region and said reference potential; and
said means for generating a control voltage waveform includes means for charging said parasitic capacitances when said control voltage is at a high level and means for discharging said parasitic capacitances when said control voltage changes from said high level to a low level.

11. A driver circuit having an output functioning in conjunction with a pull-up resistor comprising:
a field effect transistor having a drain region, a source region, a gate region, and a drain-source conduction path having a conductivity and having a resistance;
said drain region being connected to an output terminal;
said source region being connected to a reference potential;
an input terminal;

means for driving said gate of said field effect transistor coupled to said input terminal and applying a control voltage to said gate of said field effect transistor;

capacitive means for storing a charge coupled to said source region; and means for discharging said capacitive means coupled between said capacitive means and said drain region whereby energy stored in said parasitic capacitances is suppressed.

12. A driver circuit according to claim 11 wherein said means for discharging includes delay means for responding to a change in voltage at said input terminal coupled between said capacitive means and said input terminal.

13. A driver circuit according to claim 12 wherein said capacitive means stores a charge when said control voltage is at a high level.

14. A driver circuit according to claim 11 wherein said discharging means comprises resistor means connected in series to said capacitive means.

* * * * *